United States Patent
Shin et al.

(10) Patent No.: US 9,117,945 B2
(45) Date of Patent: Aug. 25, 2015

(54) CARBON NANO-TUBE (CNT) THIN FILM TREATED WITH CHEMICAL HAVING ELECTRON WITHDRAWING FUNCTIONAL GROUP AND MANUFACTURING METHOD THEREOF

(75) Inventors: Hyeon Jin Shin, Suwon-si (KR); Seonmi Yoon, Yongin-si (KR); Jaeyoung Choi, Suwon-si (KR); Young Hee Lee, Suwon-si (KR); Seong Jae Choi, Seoul (KR); Soo Min Kim, Daegu (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 1453 days.

(21) Appl. No.: 12/031,332

(22) Filed: Feb. 14, 2008

(65) Prior Publication Data
US 2010/0279001 A1    Nov. 4, 2010

(30) Foreign Application Priority Data

Jul. 26, 2007    (KR) .................. 10-2007-0075211

(51) Int. Cl.
C01B 31/02    (2006.01)
H01B 1/04    (2006.01)
H01L 31/0224    (2006.01)
B82Y 20/00    (2011.01)

(52) U.S. Cl.
CPC ......... H01L 31/022466 (2013.01); B82Y 20/00 (2013.01); G02B 2207/101 (2013.01)

(58) Field of Classification Search
CPC .................... B82Y 20/00; H01L 31/022466
USPC ......... 252/500–511; 423/445 B, 460; 427/77; 977/742, 745, 746, 842, 882, 932
See application file for complete search history.

(56) References Cited

U.S. PATENT DOCUMENTS 7,161,107 B2    1/2007 Krupe et al.
2004/0184982 A1    9/2004 Burrington et al.
(Continued)

FOREIGN PATENT DOCUMENTS

JP    2005-075661    3/2005
KR    10-2006-0060144    6/2006
(Continued)

OTHER PUBLICATIONS

Bower et al. ("Intercalation and partial exfoliation of single-walled carbon nanotubes by nitric acid." Chem phys let 288, pp. 481-486, May 22, 1998).*

(Continued)

Primary Examiner — Tri V Nguyen
(74) Attorney, Agent, or Firm — Cantor Colburn LLP

(57) ABSTRACT

Disclosed are a carbon nano-tube (CNT) thin film treated with chemical having an electron withdrawing functional group and a manufacturing method thereof. Specifically, the CNT thin film comprises a CNT composition to be applied on a plastic substrate. The CNT composition comprises a CNT; and chemical connected to the CNT and having an electron withdrawing functional group. In addition, the method for manufacturing a CNT thin film comprises steps of preparing a CNT; treating the CNT with chemical having an electron withdrawing functional group; mixing the CNT treated with the chemical with a dispersing agent or dispersing solvent to prepare a CNT dispersed solution; and forming a CNT thin film with the CNT dispersed solution. According to the CNT thin film and the manufacturing method thereof, a resistance of an electrode is decreased to improve the electric conductivity of the electrode.

10 Claims, 8 Drawing Sheets

(56) References Cited

U.S. PATENT DOCUMENTS

| | | | |
|---|---|---|---|
| 2004/0202603 A1* | 10/2004 | Fischer et al. | 423/447.2 |
| 2004/0223900 A1* | 11/2004 | Khabashesku et al. | 423/447.1 |
| 2004/0253741 A1 | 12/2004 | Star et al. | |
| 2005/0208304 A1* | 9/2005 | Collier et al. | 428/403 |
| 2006/0045838 A1* | 3/2006 | Lucien Malenfant et al. | 423/447.1 |
| 2006/0081882 A1* | 4/2006 | Malenfant et al. | 257/203 |
| 2006/0083762 A1* | 4/2006 | Brun et al. | 424/401 |
| 2007/0037057 A1 | 2/2007 | Douglas | |
| 2007/0224106 A1* | 9/2007 | Sakakibara et al. | 423/447.2 |
| 2007/0280876 A1* | 12/2007 | Tour et al. | 423/460 |
| 2008/0296537 A1* | 12/2008 | Gordon et al. | 252/506 |
| 2009/0306427 A1* | 12/2009 | Martinez-Rubi et al. | 562/590 |

FOREIGN PATENT DOCUMENTS

| | | | |
|---|---|---|---|
| KR | 1020070016766 A | 2/2007 | |
| WO | 2005/012172 A2 | 2/2005 | |
| WO | WO 2005052053 A1 * | 6/2005 | C08L 39/06 |
| WO | WO2005/113434 A1 * | 12/2005 | C01B 31/02 |

OTHER PUBLICATIONS

Roubeau et al. Covalent functionalization of carbon nanotubes through organometallic reduction and eletrophilic attack. J. of nanoscience and nanotechnology. vol. 7, p. 3509-3513, 2007.*

Holzinger et al. ("Sidewall Functionalization of Carbon Nanotubes." Angew Chem Int Ed, 40(21), pp. 4002-4005, Online Oct. 31, 2001).*

Hirsch et al. ("Functionalization of Carbon Nanotubes." Top Curr Chem, 245, pp. 193-237, 2005).*

Liang ("Single Wall Carbon Nanotube/Polyacrylonitrile Composite Fiber." Master Thesis, Georgia Institute of Technology, p. 1-57, Oct. 2004).*

Woods ("Adsorption of simple benzene derivatives on carbon nanotubes." Phys Rev B, 75, 155415-1 to -9, pub Apr. 17, 2007).*

Star et al. ("Interaction of Aromatic Compounds with Carbon Nanotubes: Correlation to the Hammett Parameter of the Substituent and Measured Carbon Nanotube FET Response." NanoLetters, 3(10), pp. 1421-1423, Web Sep. 20, 2003).*

Lemek et al. ("Non-Covalent Functionalization of Multi-Walled Carbon Nanotubes withOr ganic Aromatic Compounds." J Nanosc Nanotech, 7, pp. 3081-3088, 2007).*

Snow et al.(Capacitance and Conductance of Single-Walled Carbon Nanotubes in the Presence of Chemical Vapors. NanoLetters, 5(12), pp. 2414-2417, 2005).*

L.M. Woods et al., "Adsorption of simple benzene derivatives on carbon nanotubes," Physical Review B, vol. 75, 2007, pp. 155415-1 to 155415-9.

C. Bower et al., "Intercalation and partial exfoliation of single-walled carbon nanotubes by nitric acid," CHemical Physics Letters, vol. 288, May 22, 1998, pp. 481-486.

* cited by examiner

CARBON NANO-TUBE (CNT) THIN FILM TREATED WITH CHEMICAL HAVING ELECTRON WITHDRAWING FUNCTIONAL GROUP AND MANUFACTURING METHOD THEREOF

CROSS-REFERENCE TO RELATED APPLICATIONS

This application claims all benefits of Korean Patent Application No. 10-2007-0075211 filed on Jul. 26, 2007 in the Korean Intellectual Property Office, the disclosures of which are incorporated herein by reference.

BACKGROUND OF THE INVENTION

1. Field of the Invention

The present invention relates to a carbon nano-tube (CNT) thin film treated with chemical having an electron withdrawing functional group and a manufacturing method thereof, and more particularly, to a CNT material treated with chemical having an electron withdrawing functional group to reduce a contact resistance between the CNTs and capable of increasing conductivity of an electrode prepared using the process, and a treating method thereof.

2. Description of the Prior Art

A transparent electrode that is transparent and allows electric current to conduct is necessary for a display device. Indium tin oxide (ITO) is currently most used for the electrode. Although the ITO is currently most used, the cost thereof is increased as the consumption of indium is increased. In particular, since the resistance is increased due to cracks occurring when the ITO electrode is bent, it is difficult to apply the ITO to a flexible device in future.

Accordingly, it is needed to develop a transparent electrode that can be applied to a flexible device. Regarding this, the CNT is most spotlighted in recent years. Since the CNT has excellent electric conductivity and strength and an easily flexible property, a flexible transparent electrode using the CNT can be widely applied, as electrode material, to energy devices such as solar cell and secondary cell as well as display devices such as LCD, OLED and paper-like display.

The most important properties required for the CNT transparent electrode include conductivity, transparency and flexibility. In general, the CNT transparent electrode is prepared by dispersing CNT powders in a solution including a dispersing agent to manufacture CNT ink and then applying the CNT ink on a plastic substrate. In order to increase the conductivity of the CNT transparent electrode, it is important for carriers to move through the CNT itself and to freely move between the CNT and the CNT.

According to the recent research, when an amount of CNT is enough for the CNT to contact each other in a transparent electrode having a CNT network structure, i.e., in a state of percolation threshold or more, the resistance of the CNT itself little influences on the CNT network film. To the contrary, the contact resistance between the CNT and the CNT has a main influence on the resistance of the CNT network film. Therefore, the formation of the CNT network and the decrease in the contact resistance between the CNT and the CNT are important for increase of the conductivity of the CNT transparent electrode.

The CNT is classified into metallic and semiconducting types. The CNT of armchair having no chirality is a metallic CNT having a bandgap of 0 and the CNT is again classified into metallic and semiconducting types depending on a degree of the chirality.

The chirality can be expressed in accordance with a wrapping direction in a carbon plate structure of the CNT. In coordinates of (n, m) indicating the direction, when n and m are multiples of 3, it is referred to as metallic. When n and m are not multiples of 3, it is referred to as semiconducting. In growing the CNT, it is probabilistically said that ⅓ or less of the entire CNTs is metallic and ⅔ or more of the entire CNTs is semiconducting. Since the metallic CNT of armchair is formed very rarely, the amount thereof may be negligible.

When a transparent electrode is formed with CNTs in which the CNTs of the above two types are mixed, a barrier is formed between the CNTs having different bandgaps and the electrons flow. Thereby, the contact resistance between the CNTs is increased to lower the conductivity of the entire CNTs. Therefore, when a transparent electrode is formed with CNTs in which the CNTs of the two types are mixed, it is necessary to lower the contact resistance between the CNTs having different bandgaps.

SUMMARY OF THE INVENTION

Accordingly, the present invention has been made to solve the above problems occurring in the prior art.

An object of the invention is to treat the CNT with chemical having an electron withdrawing functional group, thereby improving the conductivity of a flexible transparent nano-electrode.

In other words, the main object of the invention is to treat CNT with chemical having an electron withdrawing functional group to reduce a contact resistance between the CNTs, thereby improving conductivity of an electrode comprising a CNT thin film prepared using the process.

In order to achieve the above object, the invention provides a CNT thin film treated with chemical having an electron withdrawing functional group and a manufacturing method thereof, and more particularly, a CNT material treated with chemical having an electron withdrawing functional group to reduce a contact resistance between the CNTs and capable of increasing conductivity of an electrode prepared using the process, and a treating method thereof.

Specifically, according to the invention, there is provided a CNT thin film comprising: a plastic substrate; and a CNT composition applied on the plastic substrate. The CNT composition includes a CNT; and chemical connected to the CNT and having an electron withdrawing functional group.

In addition, according to a first embodiment of the invention, there is provided a method of manufacturing a CNT thin film, comprising steps of: preparing a CNT; treating the CNT with chemical having an electron withdrawing functional group; mixing the CNT treated with the chemical with a dispersing agent or dispersing solvent to prepare a CNT dispersed solution; and forming a CNT thin film with the CNT dispersed solution.

Further, according to a second embodiment of the invention, there is provided a method of manufacturing a CNT thin film, comprising steps of mixing a CNT with a dispersing agent or dispersing solvent to prepare a CNT dispersed solution; forming a CNT thin film with the CNT dispersed solution; and treating a surface of the CNT thin film with chemical having an electron withdrawing functional group.

In the mean time, it is possible to implement a CNT electrode comprising the CNT thin film having the structure described above and to realize a thin film transistor (TFT) constituting an electrode and a channel material using the CNT thin film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

Figure 1:
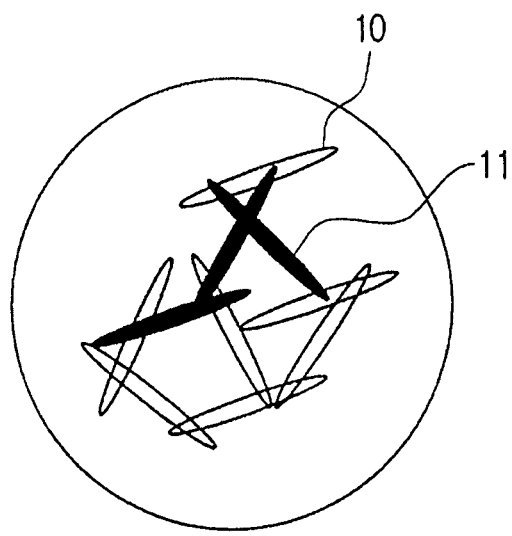
FIG. 1 shows that a contact resistance is generated between CNTs when a CNT thin film is prepared with CNTs in which metallic CNTs and semiconducting CNTs are mixed.

FIG. 1 shows that a contact resistance is generated between CNTs when a CNT thin film is prepared with CNTs in which metallic CNTs and semiconducting CNTs are mixed. A Schottky barrier is generated between a metallic CNT and a semiconducting CNT having different bandgaps. As shown in FIG. 1, electrons flow between the metallic CNT and the semiconducting CNT contacting each other and having different properties. Thus, the contact resistance is generated between the metallic CNT and the semiconducting CNT having different properties. This results in the decrease of conductivity of the CNTs in which metallic CNTs and semiconducting CNTs are mixed. Therefore, when a transparent electrode is formed using a CNT thin film in which metallic CNTs and semiconducting CNTs are mixed, it is necessary to decrease the contact resistance between the CNTs having different bandgaps.

Calculating the conductivity relating to the contact resistance between the metallic CNT and the semiconducitng CNT, the conductivity of the metallic CNT itself is about 4 $e^2/h$ and the conductivity of the semiconducting CNT is about 0.1 $e^2/h$. The conductivity when the CNTs having different properties are contacted is calculated as shown in a table 1. An arrow in the table 1 indicates the flow direction of the electrons.

TABLE 1

| | |
|---|---|
| metallic CNT → semiconducting CNT | 0.26 $e^2/h$ |
| semiconducting CNT → semiconducting CNT | 0.06 $e^2/h$ |
| semiconducting CNT → metallic CNT | 0.008 $e^2/h$ (Schottky barrier) |

For the above three cases, the electric conductivity is lowest in the third case wherein the electrons flow from the semiconducting CNT to the metallic CNT. In this case, the Schottky barrier is formed, thereby lowering the electric conductivity of the entire CNTs.

Like this, for the CNTs in which the metallic and semiconducting CNTs are mixed, a barrier between the metallic CNT and the semiconducting CNT can be adjusted by treating the CNTs with chemical having an electron withdrawing functional group. This will be described in more detail.

Figure 2A:
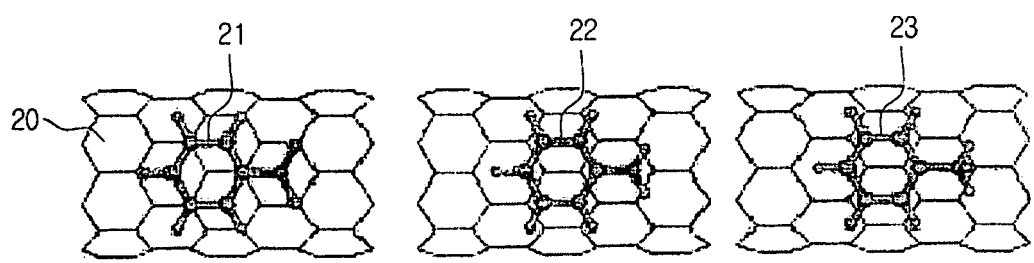
FIG. 2A shows that an aromatic compound is connected to a CNT surface according to an embodiment of the invention.

FIG. 2A shows that aromatic compounds 21, 22, 23 are adsorbed to a CNT surface 20 according to an embodiment of the invention. Generally, in an aromatic compound, it is possible to introduce a variety of functional groups having benzene as backbone, instead of hydrogen. The aromatic compounds 21, 22, 23 shown in FIG. 2A have functional groups of $NH_2$, $CH_3$ and $NO_2$ that are connected to each aromatic ring thereof, respectively.

From FIG. 2A, it can be seen that each of the aromatic compounds 21, 22, 23 is adsorbed on the CNT surface 20 in a direction that the aromatic ring thereof is horizontally contacted to a carbon plate-shaped structure of the CNT. Like this, in the course of the adsorption of the aromatic compounds 21, 22, 23 on the CNT surface 20, electrons are transferred between the aromatic compounds 21, 22, 23 and the CNT surface 20. Depending on the properties of the functional groups of the aromatic compounds 21, 22, 23, the entire resistance of the CNT can be reduced by the electron transfer.

Figure 2B:
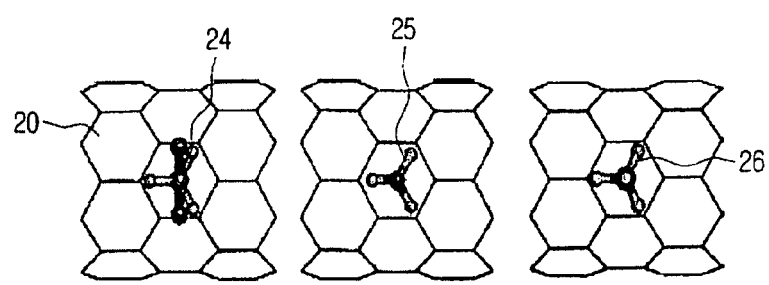
FIG. 2B shows that an aliphatic compound is connected to a CNT surface according to an embodiment of the invention.

FIG. 2B shows that aliphatic compounds 24, 25, 36 are adsorbed to the CNT surface 20 according to an embodiment of the invention. Generally, in an aliphatic compound, it is possible to introduce a variety of functional groups, instead of hydrogen of an alkyl group. The aromatic compounds 24, 25, 26 shown in FIG. 2B have functional groups of $NH_2$, $CH_3$ and $NO_2$ that are connected to each alkyl group thereof, respectively.

From FIG. 2B, it can be seen that each of the aliphatic compounds 24, 25, 26 is adsorbed on the CNT surface 20 in a form that it is connected in a carbon ring of a carbon plate-shaped structure of the CNT. As described above with regard to the aromatic compound, in the course of the adsorption of the aliphatic compounds 24, 25, 26 on the CNT surface 20, the electrons are transferred between the aliphatic compounds 24, 25, 26 and the CNT surface 20. Depending on the properties of the functional groups of the aliphatic compounds 24, 25, 26, the entire resistance of the CNT can be reduced by the electron transfer.

Figure 3:
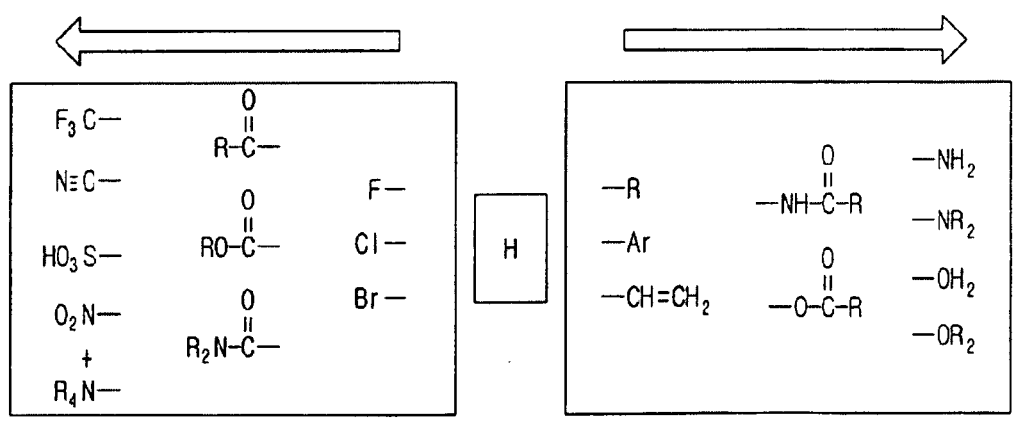
FIG. 3 shows that electron donating or withdrawing functional groups are arranged depending on functional strengths thereof.

FIG. 3 shows that electron donating or withdrawing functional groups are arranged depending on functional strengths thereof. As described above, for the aromatic compound, it is possible to introduce a variety of functional groups having benzene as backbone, instead of hydrogen. The functional groups can be classified into a functional group capable of donating an electron, which is arranged in the right side on the basis of hydrogen in FIG. 3, and a functional group capable of withdrawing an electron, which is arranged in the left side.

In the arrangements of the respective functional groups shown in FIG. 3, the functional group capable of donating an electron has the stronger tendency to be oxidized by donating an electron the farther the right side based on the hydrogen. This means that the reductive force for the CNT is higher. In addition, the functional group capable of withdrawing an electron has the stronger tendency to be reduced by taking an electron, the farther the left side based on the hydrogen. This means that the oxidative force for the CNT is higher.

Figure 4A:
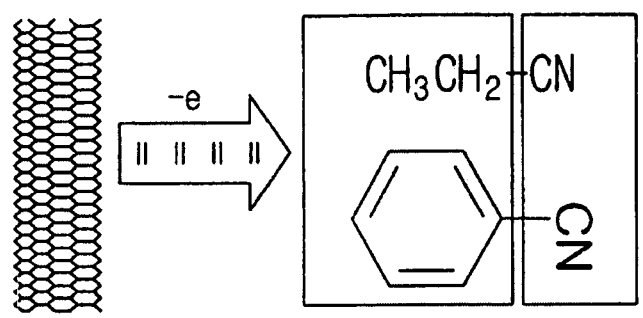
FIG. 4A shows a charge transfer mechanism between chemical having an electron withdrawing functional group and a CNT according to an embodiment of the invention.

FIG. 4A shows a charge transfer mechanism between chemical having an electron with drawing functional group and a CNT according to an embodiment of the invention. FIG. 4A shows a process in which —CN functional group obtains an electron from backbone of $CH_3CH_2$— to make an extra electron in the functional group and the aromatic compound, in which the backbone is deficient in the electron, is adsorbed on the CNT surface to take an electron from the CNT.

It is described a general mechanism how chemical acts on the CNT when the chemical is adsorbed on the CNT as shown in FIG. 4A.

When a functional group capable of withdrawing an electron is introduced to the backbone of the aromatic or aliphatic compound, the functional group attracts the electron from the backbone, so that the backbone is deficient in the electron and the functional group has the sufficient electrons. In this case, when the chemical is adsorbed to the CNT and the backbone thus acts, the CNT loses an electron. Since the CNT apt to relatively lose an electron is metallic CNT, it reduces a barrier when the barrier is generated, thereby increasing the conductivity.

Figure 4B:
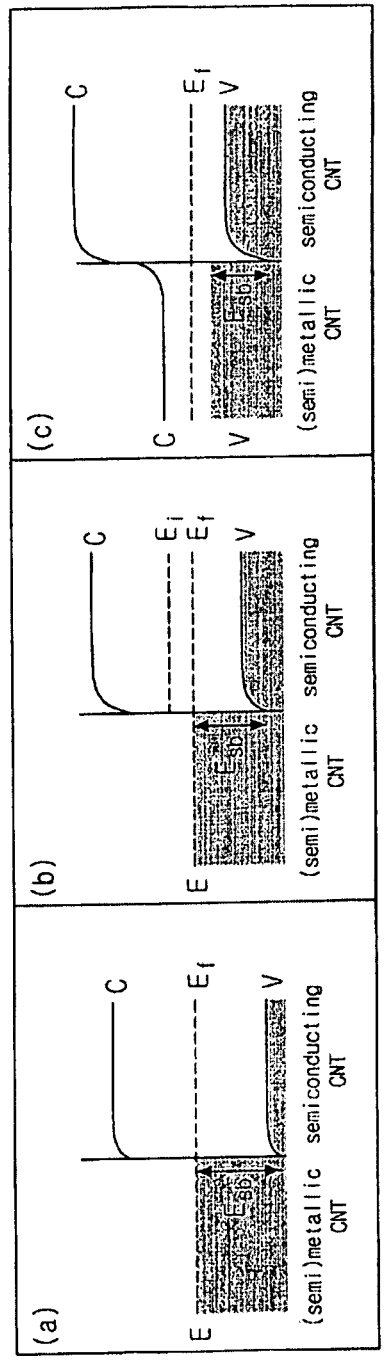
FIG. 4B is a schematic view showing barrier changes between CNTs depending on a charge transfer mechanism between chemical having an electron donating or withdrawing functional group and a CNT.

FIG. 4B is a schematic view showing barrier changes between CNTs depending on a charge transfer mechanism between chemical having an electron donating or withdrawing functional group and a CNT. In FIG. 4B, the case where the CNT is treated with chemical having an electron donating functional group is shown in the left view (a) based on the central view (b) of FIG. 4B, and the case where the CNT is treated with chemical having an electron withdrawing functional group is shown in the right view (c).

In each view of FIG. 4B, the left side based on the central line shows the metallic CNT and the right side shows the semiconducting CNT. Among them, the view (c) shows that the barrier of the CNT is reduced in accordance with the mechanism of FIG. 4A: In other words, it can be seen from the view (c) that for the electron withdrawing functional group, the metallic CNT loses an electron, so that it is moved to the arrow direction and the barrier between the metallic CNT and the semiconducting CNT is thus decreased.

Regarding this, the acid treatment is generally performed for the refinement purpose when manufacturing the CNT. After the acid treatment, the CNT is lightly p-doped as shown in the view (b). When such CNT is treated with chemical having an electron withdrawing functional group, the CNT is more thickly p-doped as shown in the view (c). To the contrary, when the CNT is treated with chemical having an electron donating functional group, the CNT can be de-doped as shown in the view (a).

In followings, with respect to an experiment for manufacturing a CNT thin film related to the mechanism as described above, experimental procedures according to each embodiment is sequentially described.

In the method for manufacturing a CNT thin film according to a first embodiment of the invention, a high-purity single-wall CNT (Southwest) 1 mg is first put in a 20 mL glass bottle, into which 10 ml chemical having an electron withdrawing functional group is then put. Then, it is put in an ultrasonic bath that is then subject to a sonification process for 10 hours to prepare a CNT solution.

Then, a filtering method is used in which a vacuum filtering device is used to pass the CNT solution 10 ml., to an aluminum film (anodisc, 200 nm) to filter it, thereby preparing a CNT bucky paper.

The CNT prepared according to the above manner is treated with chemical having an electron withdrawing functional group, so that the chemical is adsorbed on the CNT surface. At this time, the chemical may be connected to the CNT surface by the electron transfer.

According to an embodiment of the invention, a liquid-phase compound is used as the chemical. For a solid compound, it should be dissolved and then used by using another solvent. Therefore, an effect thereof may be deteriorated by the functional group present in the solvent. In addition, the chemical may include a mono-functional group only, or may include plural functional groups (bi-functional group and tri-functional group etc) which are homogeneous or heterogeneous.

Furthermore, according to an embodiment of the invention, as the functional group, a group capable of withdrawing an electron may be used such as —$CF_3$, —CN, —S=O, —$SO_3H$, —$NO_2$, —$NR_4^+$, —COR, —COOR, —$CONR_2$, —F, —Cl and —Br where R is H or alkyl group or aryl group of $C_1$-$C_{15}$. In addition, the chemical including the functional group may include dichloroethane, dibromoethane, iodobenzene, formic acid, acetic acid, formanide, dimethyl sulfoxide, nitromethane, nitrobenzene, nitric acid, acetonitrile, benzonitrile, perfluoro alkane and the like.

The CNT bucky paper treated with the chemical is mixed with a dispersing agent or dispersing solvent to be re-dispersed, so that a CNT dispersed solution is prepared. Using the CNT dispersed solution, a CNT thin film is manufactured.

After the CNT thin film is manufactured through the respective steps of the experimental process, a surface resistance is measured with a surface resistance measurer. The resistance is measured for each of the various functional groups.

In addition, in a method for manufacturing a CNT thin film according to a second embodiment of the invention, a CNT dispersed solution is first prepared. Firstly, a high-purity CNT 1 mg is put in a 20 mL glass bottle, into which 10 ml N-methylpyrrolidone (NMP) is then put. Then, it is put in an ultrasonic bath that is then subject to a sonification process for 10 hours. The CNT-NMP solution is put in a 50 mL conical tube, which is then centrifugally separated at 10,000 rpm for 10 minutes. After the centrifugal separation, only the CNT dispersed solution that is not deposited is taken to prepare a CNT dispersed solution.

Then, a filtering method as the method for manufacturing a CNT thin film is used in which a vacuum filtering device is used to pass the CNT solution 2 ml, to an aluminum film to filter it, thereby preparing a CNT thin film.

The CNT prepared according to the above manner is treated with chemical having an electron withdrawing functional group, so that the chemical is adsorbed on the CNT surface. At this time, the chemical may be connected to the surface of the CNT by the electron transfer.

After the CNT thin film is manufactured through the respective steps of the experimental process, a surface resistance is measured with a surface resistance measurer. The resistance is measured for each of the various functional groups.

As the measure results of the surface resistance for the CNT thin films prepared according to the respective embodiments, the surface resistance of the CNT thin film treated with the chemical having an electron withdrawing functional group was decreased. In other words, the contact resistance between the CNTs can be reduced by treating the CNT with the chemical having an electron withdrawing functional group.

A table 2 shows the measure results of the resistance for the CNT bucky paper treated with the chemical according to the experimental processes described with reference to the first embodiment of the invention. At this time, the hexane, which is the aliphatic compound having no functional group, and the benzene, which is the aromatic compound having no functional group, were used as comparative examples. Also, it is shown the surface resistances resulting from the introduction of the various electron withdrawing functional groups (unit: Ω/sq).

TABLE 2

| functional group | compound structure | compound name | Bp (° C.) | surface resistance (per 1 mg) |
|---|---|---|---|---|
| —CH₃ | CH₃(CH₂)₄CH₃ | hexane | 68~70 | 67.72 |
| H | benzene ring | benzene | 80 | 79.43 |
| Cl— | ClCH₂CH₂Cl | dichloroethane | 82~84 | 12.5 |
| Br— | BrCH₂CH₂Br | dibromoethane | 131~133 | 7.684 |
| I— | phenethyl | iodobenzene | 63~65 | 12.81 |
| HO—C(=O)— | HCOOH | formic acid | 100~101 | 7.154 |
| | | acetic acid | | 38.11 |
| H₂N—C(=O)— | HC(=O)NH₂ | formamide | 210 | 9.883 |
| HO₃S— | (CH₃)₂S=O | dimethyl sulfoxide | 189 | 17.31 |
| O₂N— | CH₃NO₂ | nitromethane | 100~102 | 4.732 |
| | C₆H₅NO₂ | nitrobenzene | 83~84 | 3.608 |
| | HNO3 | nitric acid | | 28.43 |
| N≡C— | CH₃CN | acetonitrile | 81~82 | 15.65 |
| | C₆H₅CN | benzonitrile | 191 | 17 |
| HO₃S— | (CH₃)₂S=O | dimethyl sulfoxide | 189 | 17.31 |
| F₃C— | | perfluoro alkane | | 17.44 |

From the data of the table 2, when comparing the hexane and benzene having no functional group as comparative compounds with the compounds having the other functional groups, it can be seen that the surface resistance was much decreased in the compounds having an electron withdrawing functional group.

In other words, the functional group capable of withdrawing an electron attracts the electron from the backbone, so that the backbone deficient in the electron and the chemical including the backbone is adsorbed to the CNT to take an electron from the CNT. Like this, as the CNT loses an electron, the barrier between the CNTs is reduced and the contact resistance between the CNTs is decreased. As a result, the surface resistance is reduced.

The mechanism and the experimental result can be also confirmed in graphs described below.

Figure 5:
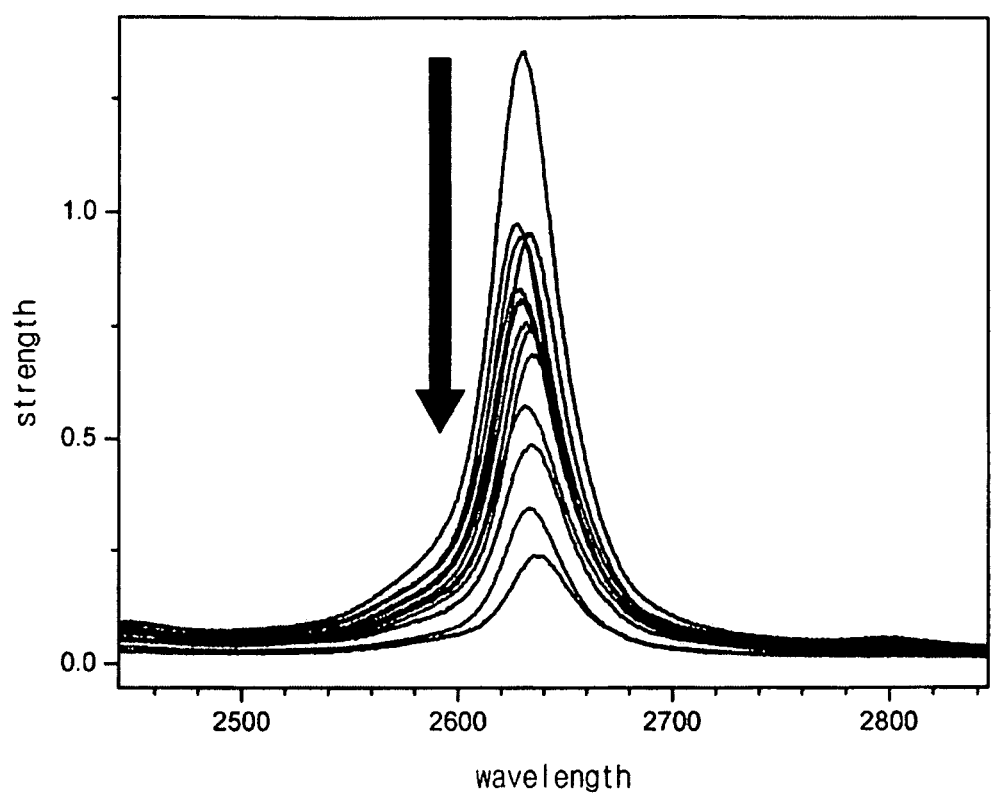
FIG. 5 is a graph showing a Raman result of RBM for a CNT thin film treated with chemical having an electron withdrawing functional group according to an embodiment of the invention.

FIG. 5 is a graph showing a Raman result of RBM (Radial Breathing Mode) for a CNT thin film treated with chemical having an electron withdrawing functional group according to an embodiment of the invention. Referring to points indicated with an arrow in FIG. 5, peaks of strength depending on the wavelengths are rapidly decreased, which means the decrease of RBM. Like this, the decrease of RBM in the Raman result is a proof that there is something strongly adsorbed on the CNT surface. From this, it can be seen that the chemical having a functional group on the CNT surface is connected by the electron transfer.

Figure 6:
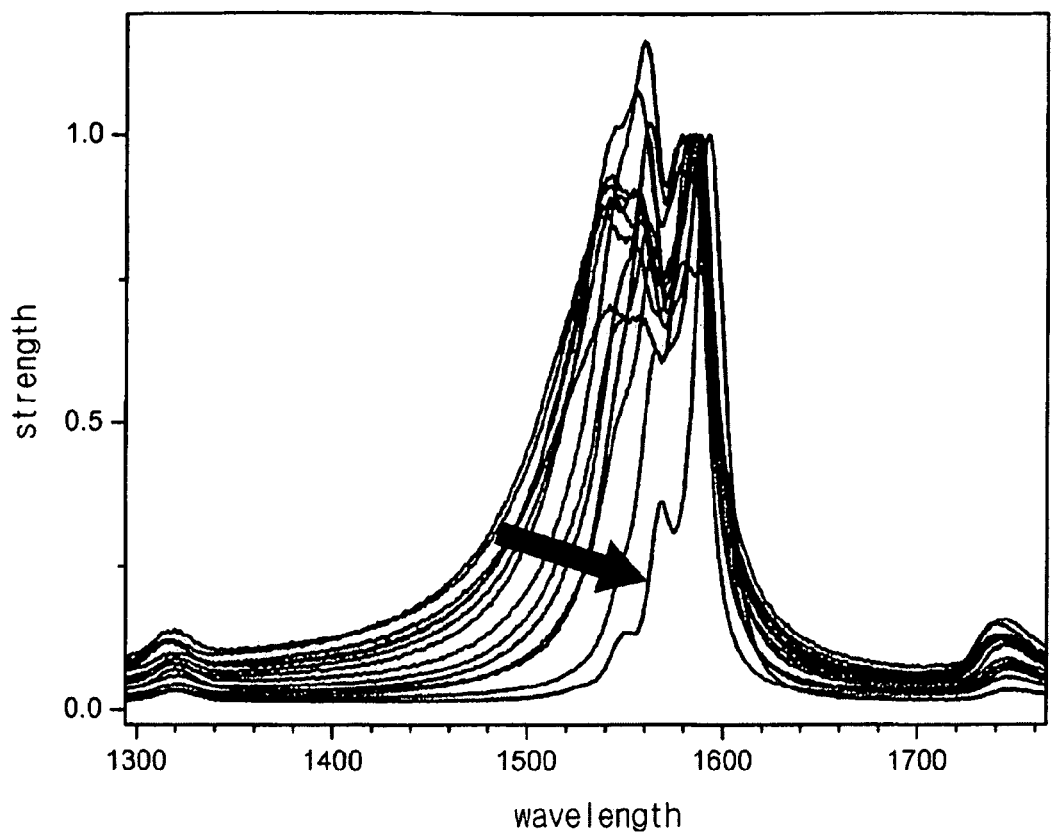
FIG. 6 is a graph showing a Raman result of BWF for a CNT thin film treated with chemical having an electron withdrawing functional group according to an embodiment of the invention.

FIG. 6 is a graph showing a Raman result of BWF for a CNT thin film treated with chemical having an electron withdrawing functional group according to an embodiment of the invention. Referring to points indicated with an arrow in FIG. 6, it can be seen that the strengths are decreased depending on the wavelengths, i.e., the line widths of BWF are decreased. Like this, the decrease of the BWF line width in the Raman result is a proof that the CNT loses an electron. In other words, it means that the chemical adsorbed on the CNT surface obtains an electron (i.e., reduced).

Figure 7:
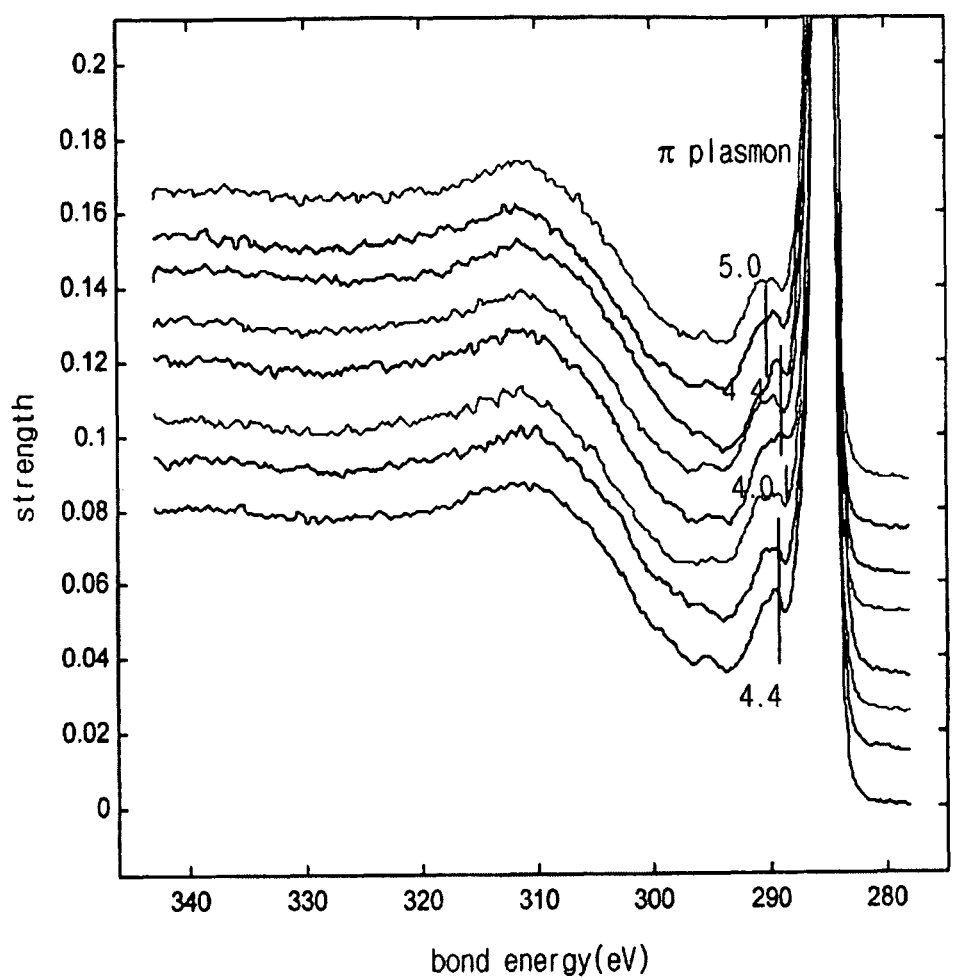
FIG. 7 is a graph showing an XPS π plasmon for a CNT thin film treated with chemical having an electron withdrawing functional group according to an embodiment of the invention.

FIG. 7 is a graph showing an XPS $\pi$ plasmon for a CNT thin film treated with chemical having an electron withdrawing functional group according to an embodiment of the invention. Referring to FIG. 7, the CNT thin film treated with chemical having an electron withdrawing functional group is changed into the low energy states as $\pi$ plasmon is changed from 5.0 to 4.0, which means that the CNT loses an electron. Therefore, from the change in $\pi$ plasmon of XPS, it can be seen that the CNT loses an electron (i.e., oxidized).

As described above, according to the invention, the CNT is treated with the chemical having an electron withdrawing functional group. Through the process, the contact resistance between the CNTs is reduced. In addition, the conductivity of an electrode prepared using the process can be increased.

Furthermore, the CNT treated with the chemical having an electron withdrawing functional group can be applied to a variety of fields such as sensor, memory and cell using the CNT.

While the invention has been shown and described with reference to certain preferred embodiments thereof, it will be understood by those skilled in the art that various changes in form and details may be made thereto without departing from the spirit and scope of the invention as defined by the appended claims.

What is claimed is:

1. A carbon nano-tube (CNT) composition comprising:
a CNT mixture comprising a metallic CNT and a semiconducting CNT; and
a chemical connected to the metallic CNT by adsorption,
wherein the chemical has an electron withdrawing functional group,
wherein the functional group is one or more group selected from a group consisting of —$CF_3$, —CN, —S=O, —$SO_3H$, —$NO_2$, —$NR_4^+$, —COR, —COOR, —$CONR_2$, —F, —Cl, —I and —Br where R is H or selected from a group consisting of alkyl group or aryl group of $C_1$-$C_{15}$,
wherein the electron withdrawing functional group attracts electrons from a backbone of the chemical, the backbone is resultantly deficient in electrons, the backbone is adsorbed on the metallic CNT surface to take electrons from the metallic CNT, thereby reducing a barrier between the metallic CNT and the semiconductor CNT, and increasing conductivity of the CNT mixture, further wherein the chemical is selected from a group consisting of dichloroethane, dibromoethane, iodobenzene, formic acid, acetic acid, formamide, nitromethane, nitrobenzene, nitric acid, acetonitrile, and benzonitrile and perfluoro alkane.

2. The CNT composition according to claim 1, wherein when the number of the functional group of the chemical having an electron withdrawing functional group is two or more, it is a homogeneous functional group or heterogeneous functional group.

3. A method of manufacturing a CNT thin film, comprising:
preparing a CNT mixture comprising a metallic CNT and a semiconducting CNT;
treating the CNT mixture with a chemical having an electron withdrawing functional group;
mixing the CNT mixture treated with the chemical with a dispersing agent or dispersing solvent to prepare a CNT dispersed solution; and
forming a CNT thin film with the CNT dispersed solution,
wherein the chemical is connected to the metallic CNT by adsorption,
wherein the functional group is one or more group selected from a group consisting of —$CF_3$, —CN, —S=O, —$SO_3H$, —$NO_2$, —$NR_4^+$, —COR, —COOR, —$CONR_2$, —F, —Cl, —I and —Br where R is H or selected from a group consisting of alkyl group or aryl group of $C_1$-$C_{15}$,
wherein the electron withdrawing functional group attracts electrons from a backbone of the chemical, the backbone is resultantly deficient in electrons, the backbone is adsorbed on the metallic CNT surface to take electrons from the metallic CNT, thereby reducing a barrier between the metallic CNT and the semiconductor CNT, and increasing conductivity of the CNT mixture, further wherein the chemical is selected from a group consisting of dichloroethane, dibromoethane, iodobenzene, formic acid, acetic acid, formamide, nitromethane, nitric acid, acetonitrile, and benzonitrile.

4. The method according to claim 3, wherein the number of the functional group of the chemical having an electron withdrawing functional group is one or more.

5. The method according to claim 4, wherein when the number of the functional group of the chemical having an electron withdrawing functional group is two or more, it is a homogeneous functional group or heterogeneous functional group.

6. The method according to claim 3, wherein the CNT mixture is treated with chemical having an electron donating functional group and is thus de-doped.

7. A method of manufacturing a CNT thin film, comprising:
mixing a CNT mixture comprising a metallic CNT and a semiconducting CNT with a dispersing agent or dispersing solvent to prepare a CNT dispersed solution;
forming a CNT thin film with the CNT dispersed solution; and
treating a surface of the CNT thin film with chemical having an electron withdrawing functional group,
wherein the chemical is connected to the metallic CNT by adsorption,
wherein the functional group is one or more group selected from a group consisting of —$CF_3$, —CN, —S=O, —$SO_3H$, —$NO_2$, —$NR_4^+$, —COR, —COOR, —$CONR_2$, —F, —Cl, —I and —Br where R is H or selected from a group consisting of alkyl group or aryl group of $C_1$-$C_{15}$, wherein the electron withdrawing functional group attracts electrons from a backbone of the chemical, the backbone is resultantly deficient in electrons, the backbone is adsorbed on the metallic CNT surface to take electrons from the metallic CNT, thereby reducing a barrier between the metallic CNT and the semiconductor CNT, and increasing conductivity of the CNT mixture, further wherein the chemical is selected from a group consisting of dichloroethane, dibromoethane, iodobenzene, formic acid, acetic acid, formamide, nitromethane, nitric acid, acetonitrile, and benzonitrile.

8. The method according to claim 7, wherein the number of the functional group of the chemical having an electron withdrawing functional group is one or more.

9. The method according to claim 8, wherein when the number of the functional group of the chemical having an electron withdrawing functional group is two or more, it is a homogeneous functional group or heterogeneous functional group.

10. The method according to claim 7, wherein the CNT mixture is treated with chemical having an electron donating functional group and is thus de-doped.

* * * * *